(12) United States Patent
Chiou et al.

(10) Patent No.: US 6,881,986 B1
(45) Date of Patent: Apr. 19, 2005

(54) DESIGN AND FABRICATION METHOD FOR FINGER N-TYPE DOPED PHOTODIODES WITH HIGH SENSITIVITY FOR CIS PRODUCTS

(75) Inventors: Yu-Zung Chiou, Taipei (TW); Kuen-Hsien Lin, Pingtung (TW); Chen Ying Lieh, Tainan (TW); Shou-Yi Hsu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/040,233

(22) Filed: Nov. 7, 2001

(51) Int. Cl.$^7$ .......................................... H01L 31/0328
(52) U.S. Cl. ..................... 257/184; 257/186; 257/187; 257/192; 257/292; 257/461; 438/149; 438/154; 438/161; 438/433; 438/481; 438/484; 438/491
(58) Field of Search ............................... 257/184, 186, 257/187, 192, 194, 199, 201, 209, 292, 438, 439, 461, 464, 509, 549, 927, 929, 293

(56) References Cited

U.S. PATENT DOCUMENTS

| | | | |
|---|---|---|---|
| 4,904,607 A | 2/1990 | Riglet et al. | 437/3 |
| 6,027,955 A | 2/2000 | Lee et al. | 438/57 |
| 6,051,447 A | 4/2000 | Lee et al. | 438/48 |
| 6,150,683 A * | 11/2000 | Merrill et al. | 257/292 |
| 6,194,258 B1 | 2/2001 | Wuu | 438/200 |
| 6,274,918 B1 * | 8/2001 | Tsai et al. | 257/492 |
| 6,323,985 B1 * | 11/2001 | Maloney | 359/248 |

* cited by examiner

*Primary Examiner*—Hoai Pham
*Assistant Examiner*—Wai-Sing Louie
(74) *Attorney, Agent, or Firm*—Thomas, Kayden, Horstemeyer & Risley

(57) ABSTRACT

A novel structure for a photodiode is disclosed. It is comprised of a p-type region, which can be a p-substrate or p-well, extending to the surface of a semiconductor substrate. A multiplicity of parallel finger-like n-wells is formed in the p-type region. The fingers are connected to a conductive region at one end.

16 Claims, 3 Drawing Sheets

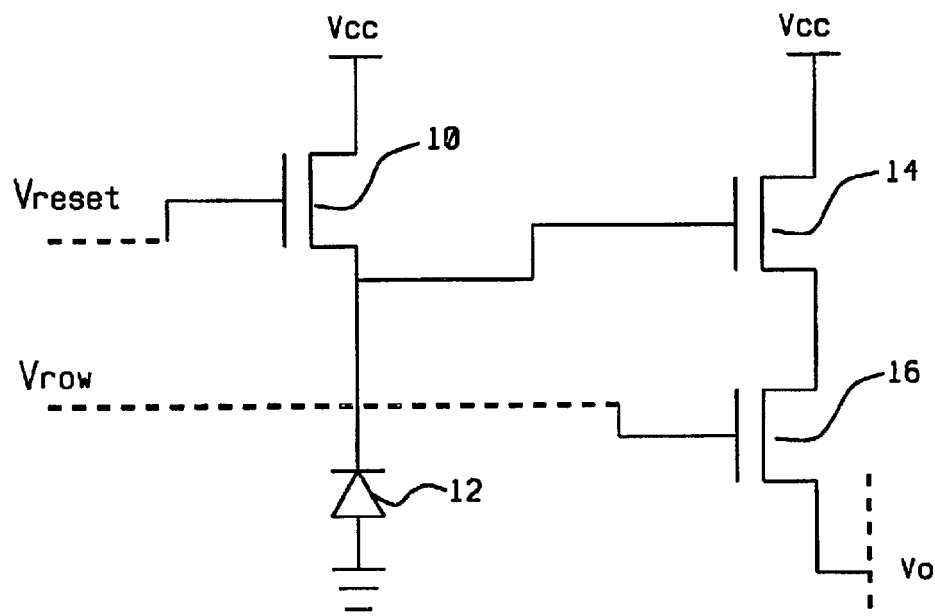
*FIG. 1 - Prior Art*
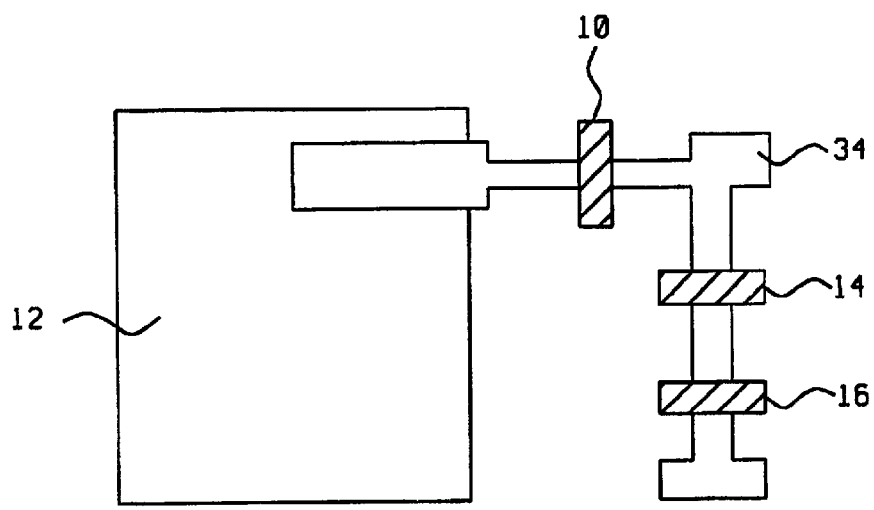
*FIG. 2 - Prior Art*

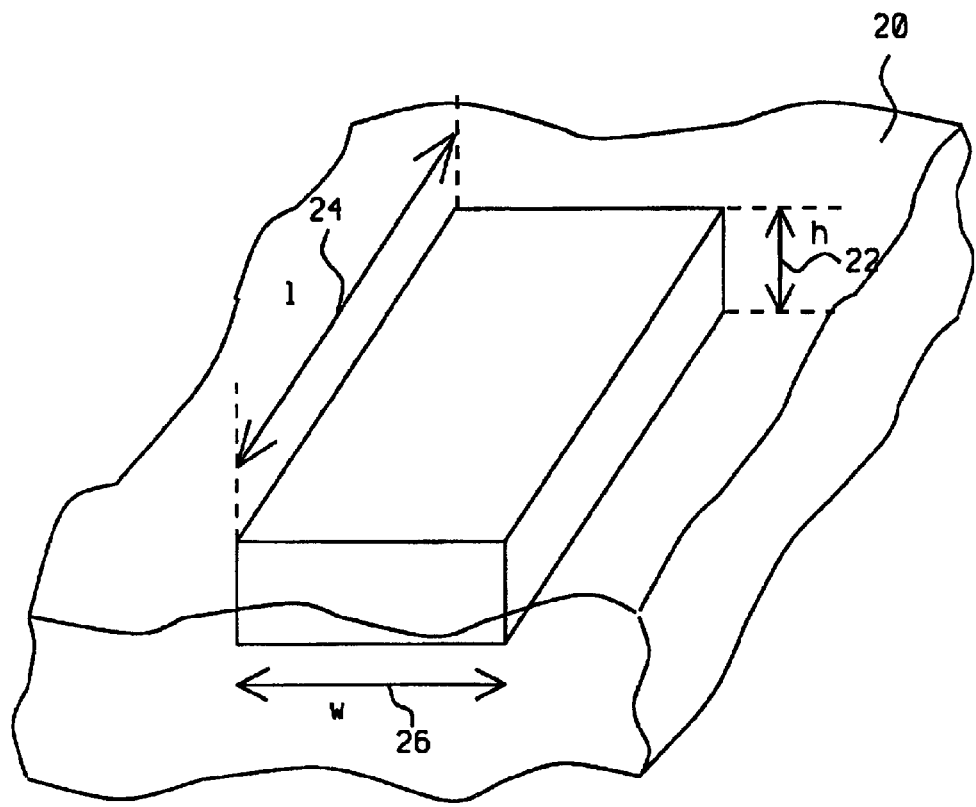
*FIG. 3 - Prior Art*
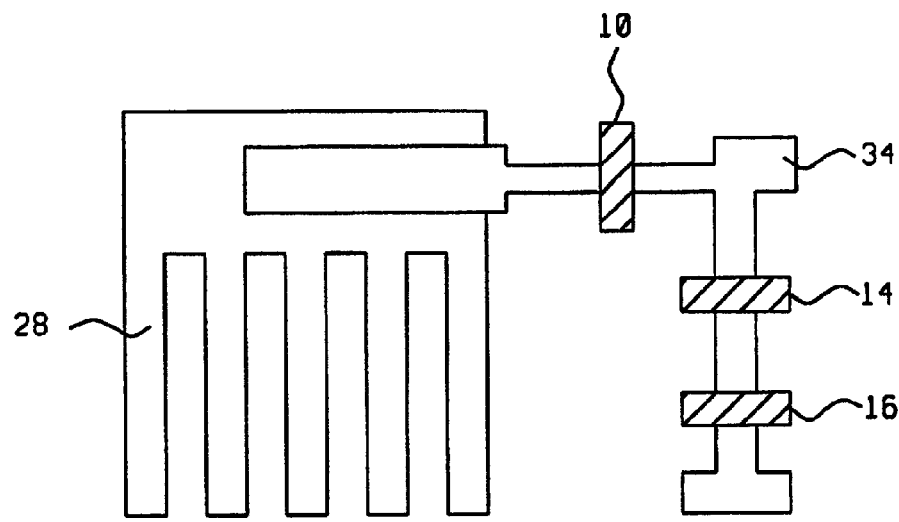
*FIG. 4*

US 6,881,986 B1

DESIGN AND FABRICATION METHOD FOR FINGER N-TYPE DOPED PHOTODIODES WITH HIGH SENSITIVITY FOR CIS PRODUCTS

BACKGROUND OF THE INVENTION (1) Field of the Invention

The present invention relates generally to semiconductor integrated circuit technology and more particularly to active pixel sensor technology.

(2) Description of Prior Art

CMOS image sensors (CIS) are widely used in a large variety of products. Examples of these products are smart phones, screen phones, digital cameras, PC cameras, surveillance equipment, digital camcorders and toys. It is expected that utilization of CIS will be even more extensive in the future. For the increased utilization of CIS products it is important that there is a concurrent increase in the quality of the CIS digital picture. A high density of pixels is required for improved picture quality. Higher pixel density implies smaller pixel area, but, in the absence of improved efficiency, smaller pixel area results in a lower efficiency. Thus just scaling down a conventional CIS pixel will result in a smaller pixel of reduced sensitivity. It is an objective of the invention to provide a novel photodiode structure that will increase the CIS pixel sensitivity to the extent that even with an extreme reduction in size the pixel sensitivity will be as good or better than conventional CIS pixels.

A popular conventional active pixel based on CMOS, shown in FIG. 1, contains one photo-diode and three n-channel MOS transistors (for reset, source follower, and row access). The "reset transistor", 10, is used for resetting the potential of the floating-node of photo-diode 12 to $V_{cc}$. The floating-node of the photo-diode is connected to the gate of "source follower" 14, where its conductance is modulated by the floating-node potential. After reset operation, the potential of photo-diode is modulated (decreasing) by accumulating electrons generated by image light (or photons) during the "image integration" period. After turning on the row access transistor, 16, Vo is read out (one $V_T$ below the floating-node potential) as the output of the image signal. The output is essentially linear with the photo-signal (i.e. floating-node potential), which is proportional to the number of electrons generated by the image light. The number of electrons generated by the image light is in turn proportional to the area of the photodiode junction. A higher sensitivity is therefor achieved for larger area photodiodes. Consequently the photodiode occupies the largest fraction of the pixel area. This is seen in FIG. 2, which shows the layout of a typical CIS pixel. The photodiode, 12, clearly occupies the majority of the pixel area. In FIG. 2, region 34 is the active pixel area except for the photodiode A traditional structure for a CIS photodiode is shown in FIG. 3, where the upper n-type region, 18, is an n-well formed in a p-type substrate, 20. A depletion region forms about an area, A0, i.e., about each of the surfaces of the n-well except for the upper surface. The photo-response is thus proportional to the area A0=lw+2h(l+w), where l is the length, 24, w is the width, 26, and h is the height, 22, of the n-well.

Pinned photodiodes are used by Lee et al., U.S. Pat. No. 6,027,955, and Lee et al., U.S. Pat. No. 6,051,447, in image sensors to increase the fill factor of the photodetector. Riglet et al., U.S. Pat. No. 4,904,607, disclose a method of manufacturing an infrared detector having a buried PIN photodiode. A method of forming an image sensor and a CMOS logic circuit device is shown in U.S. Pat. No. 6,194,258 to Wuu. The method shows how to prevent the formation of metal silicide on the photodiode element.

SUMMARY OF THE INVENTION

It is a primary objective of the invention to provide a photodiode structure having an increased photosensitivity. It is also a primary objective of the invention to provide a method of fabricating such a structure. The structure of a photodiode of the invention is specifically designed to substantially increase its junction area, without increasing the overall area taken up by the photodiode. Thus the sensitivity of a photodiode of the invention is much larger than that of a traditional photodiode of the same overall area. To affect this increase in junction area of a photodiode of the invention, a multi-finger-like structure is formed. Instead of a single large n-well in a p-substrate, many smaller parallel n-wells are formed is a p-substrate. In this way the total junction area, summing contributions from all the parallel n-wells, can be made to be much larger than the junction area of a single large n-well covering the same overall area. As a result the sensitivity of a photodiode of the invention can be made to be much larger than a conventional photodiode of the same overall area.

A novel structure for a photodiode is disclosed. It is comprised of a p-type region, which can be a p-substrate or p-well, extending to the surface of a semiconductor substrate. A multiplicity of parallel finger-like n-wells is formed in the p-type region. The fingers are connected to a conductive region at one end.

BRIEF DESCRIPTION OF THE DRAWINGS

In the accompanying drawing forming a material part of this description, there is shown:

FIG. 1 shows a conventional active CMOS pixel.

FIG. 2 shows a layout a conventional CMOS pixel.

FIG. 3 shows a structure of a conventional CMOS pixel photodiode.

FIG. 4 shows a layout of a CMOS pixel according to the invention.

DESCRIPTION OF THE PREFERRED EMBODIMENTS

Figure 5:
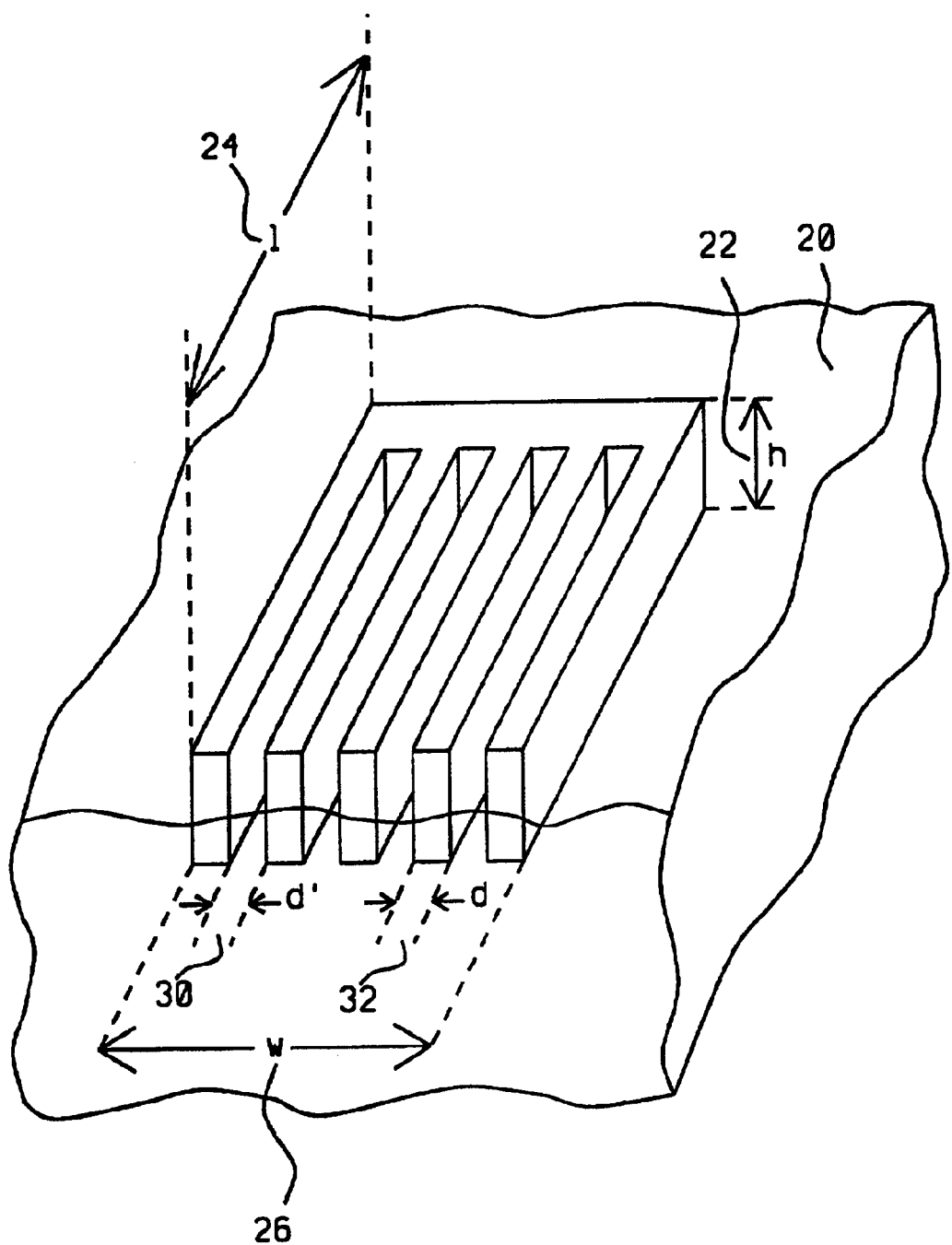
FIG. 5 shows a structure according to the invention of a CMOS pixel photodiode.

The layout of a preferred embodiment of the new pixel type is shown in FIG. 4. By comparison with FIG. 2, it is seen that a new pixel type differs from a conventional pixel in the structure of the photodiode. The structure of a photodiode of the invention is specifically designed to substantially increase its junction area, without increasing the overall area, lw, taken up by the photodiode. To affect this increase in junction area of a photodiode of the invention, a multi-finger-like structure, 28, is formed, as is shown in more detail in FIG. 5. The number of fingers shown in FIG. 5 is chosen only for purposes of illustration. Essentially, instead of a single large n-well in a p-substrate, many smaller parallel n-wells are formed in a p-substrate. In this way the total junction area, summing contributions from all the parallel n-wells, can be made to be much larger than the junction area of a single large n-well covering the same overall area, lw. In a region of width d', 32, between fingers of width d, 30, there are two surfaces of area hl' each, where l'(l'<l) is the finger length, that were not present in the conventional structure, and which contribute to the junction area. An area d'l has been subtracted from the junction area for each region 32. Therefor, if the number of such regions 32 is n, the junction area of a photodiode according to the invention is A=A0+nl'(2h−d'). The number of separation regions, n, is related to the finger width, d, the separation width, d', and the overall width, w, by the relation, n(d+d')= (w−d). If 2h>d' the junction area of a photodiode according to the invention, A, is greater than A0, the junction area of a corresponding conventional photodiode. When h is substantially larger than d' and there are many fingers A can be much larger than A0. For instance when d=d', h=5d and n=10, A is about 4A0; in other words, there is about a fourfold increase in sensitivity.

There are affects that limit the number of fingers. When the finger separation is near or less than twice the width of the p-substrate depletion region than the area 2lh overestimates the contribution of the region 32 to the depletion region. Thus it does not pay to decrease d' below about twice the p-substrate depletion width. Another limiting affect is that d should be kept large enough so that size effect contributions to the finger resistance are within acceptable limits. These limitations are readily met and do not preclude structures that lead to significant increases in sensitivity.

The fabrication of a photodiode of the new pixel type involves forming a multiplicity of finger-like n-wells in a p-substrate and connecting them electrically so that they act in parallel. Processes for forming n-wells are in common use and well known to practitioners of the art. A special consideration for n-wells of photodiodes of the invention is that it is advantages to make the n-wells deep, whereas in conventional photodiodes this is not important. Thus, for example, phosphorous implant energies in the range between hundreds of keV to several MeV are used for the n-wells of the invention to achieve n-well depths of about or greater than 2 microns.

Although in the preferred embodiments described above finger-like n-wells are formed in a p-substrate, in other preferred embodiments finger-like n-wells can be formed in other kinds of p-regions, such as more extensive p-wells. In yet other embodiments, instead of finger-like n-wells formed in a p-region, the structure of the photodiode can be finger-like p-wells in an n-region. Furthermore, the invention is not restricted to a photodiode in a CIS image sensor. It is relevant to any photo-detecting system that utilizes a semiconductor junction as the photo-detector. Structuring the junction according to the invention will increase the photo-sensitivity.

While the invention has been particularly shown and described with reference to the preferred embodiments thereof, it will be understood by those skilled in the art that various changes in form and detail may be made without departing from the spirit and scope of the invention.

What is claimed is:

1. A structure of an image sensor, comprising:
   at least one photodiode region formed in a semiconductor substrate; and
   at least one transistor;
   wherein the photodiode region comprises:
   a p-type region extending to a surface of the semiconductor substrate; and
   an n well region formed in said p-type region, wherein the n well region comprises a bar portion and a plurality of parallel finger portions extending from the bar portion, and the bar portion is electrically connected to the transistor via a connection.

2. The structure of claim 1 wherein said p-type region is a p-substrate.

3. The structure of claim 1 wherein said p-type region is a p-well.

4. The structure of claim 1 wherein said parallel finger portions are formed by phosphorous ion implantation.

5. The structure of claim 1 wherein the depth of said parallel finger portions is between about 1 and 5 microns.

6. The structure of claim 1 wherein the width of said parallel finger portions is between about 0.5 and 2 microns.

7. The structure of claim 1 wherein the separation of said parallel finger portions is between about 0.5 and 2 microns.

8. The structure of claim 1 wherein the number of said parallel finger portions is greater than 3.

9. A method of fabricating a structure for of an image sensor, comprising:
   forming at least one photodiode region formed in a semiconductor substrate; and
   providing at least one transistor;
   wherein formation of the photodiode region comprises:
   forming a P-type region extending to a surface of the semiconductor substrate; and
   forming an n well region formed in said p-type region, wherein the n well region comprises a bar portion and a plurality of parallel finger portions extending from the bar portion, and the bar portion is electrically connected to the transistor via a connection.

10. The method of claim 9 wherein said p-type region is a p-substrate.

11. The method of claim 9 wherein said p-type region is a swell.

12. The method of claim 9 wherein said parallel finger portions are formed by phosphorous ion implantation.

13. The method of claim 9 wherein the depth of said parallel finger portions is between about 1 and 5 microns.

14. The method of claim 9 wherein the width of said parallel finger portions is between about 0.5 and 2 microns.

15. The method of claim 9 wherein the separation of said parallel finger portions is between about 0.5 and 2 microns.

16. The method of claim 9 wherein the number of said parallel finger portions is greater than 3.

* * * * *